United States Patent

Iwahashi et al.

[11] Patent Number: 6,049,132
[45] Date of Patent: Apr. 11, 2000

[54] MULTIPLE METALLIZATION STRUCTURE FOR A REFLECTION TYPE LIQUID CRYSTAL DISPLAY

[75] Inventors: Masanori Iwahashi; Makoto Mizuno, both of Utsunomiya; Koji Hanihara, Isawa-cho, all of Japan

[73] Assignees: Kawasaki Steel Corporation, Kobe; Pioneer Electronic Corporation, Tokyo; Pioneer Video Corporation, Yamanashi, all of Japan

[21] Appl. No.: 08/893,671

[22] Filed: Jul. 11, 1997

[30] Foreign Application Priority Data

Jul. 12, 1996 [JP] Japan ................................. 8-183152
Jul. 18, 1996 [JP] Japan ................................. 8-189037

[51] Int. Cl.⁷ .......................... H01L 23/48; H01L 23/52; H01L 29/40
[52] U.S. Cl. .......................... 257/763; 257/750; 257/752; 257/758; 257/760; 257/762; 257/764; 257/765; 257/766; 257/768; 257/769; 257/770; 349/113; 349/139; 349/147; 349/149; 349/152
[58] Field of Search ........................ 257/763, 915, 257/760, 764, 765, 766–770, 750–752, 758, 762, 436; 349/113, 139, 140, 143, 147, 149, 151, 152

[56] References Cited

U.S. PATENT DOCUMENTS

| | | | |
|---|---|---|---|
| 3,966,302 | 6/1976 | Mikoda et al. ...................... | 350/334 |
| 5,331,204 | 7/1994 | Kuroda et al. ...................... | 257/758 |
| 5,359,441 | 10/1994 | Mori et al. ........................... | 359/51 |
| 5,365,091 | 11/1994 | Yamagishi ........................... | 257/203 |
| 5,633,532 | 5/1997 | Sohara et al. ....................... | 257/700 |
| 5,656,833 | 8/1997 | Kajihara ............................. | 257/203 |
| 5,708,486 | 1/1998 | Miyawaki et al. ................... | 349/111 |
| 5,747,880 | 5/1998 | Havemann et al. ................. | 257/759 |
| 5,834,845 | 11/1998 | Stolmeijer .......................... | 257/752 |
| 5,847,466 | 12/1998 | Ito et al. ............................. | 257/775 |
| 5,892,563 | 4/1999 | Ono et al. ........................... | 349/143 |
| 5,929,948 | 7/1999 | Ohori et al. ........................ | 349/44 |
| 5,990,988 | 11/1999 | Hanihara et al. ................... | 349/48 |

FOREIGN PATENT DOCUMENTS 58-34945   3/1983   Japan ................................. 257/760

*Primary Examiner*—Jerome Jackson, Jr.
*Assistant Examiner*—Bradley William Baumeister
*Attorney, Agent, or Firm*—Oliff & Berridge, PLC

[57] ABSTRACT

In a semiconductor chip for Si chip based liquid crystal having insulating films and interconnection layers formed on a semiconductor substrate, a thin interconnection layer made of TiN/Ti having strong erosion resistance is formed on an uppermost interlayer insulating film having a flat surface to substantially expose the thin uppermost interconnection layer to the surface of the chip, the uppermost insulating film is covered with a protection film made of p-SiN and a thin insulating film having a mirror-like flat surface is formed on the uppermost interconnection layer.

20 Claims, 10 Drawing Sheets

Si substrate

Oxidation film (LOCOS, Gate Ox NSG/BPSG, p-TEOS etc)

S/D region p-SiN p-Si

Al-Si

TiN/Ti

FIG. 8
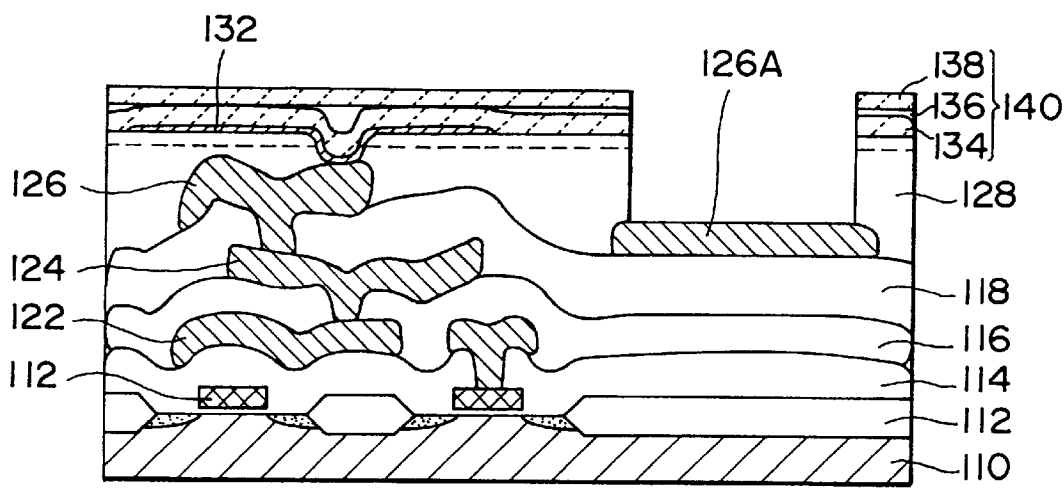
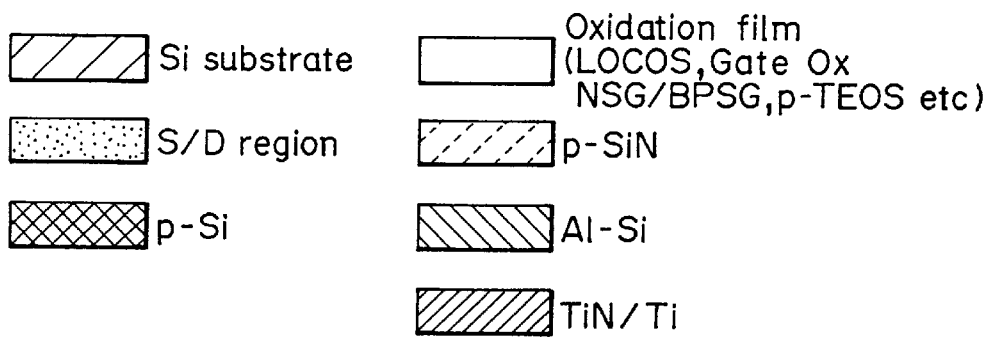

| | Si substrate | | Oxidation film (LOCOS, Gate Ox NSG/BPSG, p-TEOS etc) |
|---|---|---|---|
| | S/D region | | p-SiN |
| | p-Si | | Al-Si |
| | | | TiN/Ti |

MULTIPLE METALLIZATION STRUCTURE FOR A REFLECTION TYPE LIQUID CRYSTAL DISPLAY

BACKGROUND OF THE INVENTION

1. Field of the Invention

The present invention relates to a semiconductor device, a manufacturing method thereof and a reflection type liquid crystal display device. In particular, the present invention relates to a semiconductor device suited to directly mount other components or devices such as a liquid crystal on the surfaces of a chip, a manufacturing method thereof and a reflection type liquid crystal display device using the semiconductor device.

2. Description of Prior Art

Normally, a semiconductor device, such as an LSI, comprises chips including various types of elements formed on a semiconductor substrate made of, for example, silicon (Si) and multilayer interconnection formed on the silicon substrate to actuate the elements. The multilayer interconnection is normally formed by conducting the following steps, repeatedly, if necessary. That is, Al layers made of, for example, Al—Si alloy are formed on an interlayer insulating film such as a silicon oxide film deposited by the CVD (Chemical Vapor Deposition) method on a substrate, to thereby form metal films. Thereafter, the metal films are processed to form predetermined patterns to thereby provide interconnection. Another interlayer insulating film is further deposited on the interconnection.

Meanwhile, if driving a reflection type liquid crystal or the like mounted on the semiconductor chip such as an Si chip based liquid crystal device, it has been required to make interlayer insulating films and a passivation film serving as an uppermost insulating film, very flat and mirror-like and as thin as possible.

In the ordinary interlayer film flattening method such as an SOG (Spin On Glass) application method and an etchback method, the uneven surface of the interconnection can be flattened to such an extent to facilitate forming an upper interconnection layer thereon. However, it is impossible to provide a high-flatness, mirror-like surface. As a method of providing a highly flattened surface, there is proposed a CMP (Chemical Mechanical Polishing) method.

Description will now be given to a case where the CMP method is applied to the conventional insulating film between multilayer interconnection and the surface of the insulating film is flattened.

FIG. 20 shows an interconnection 2 formed on a flat insulating film 1 to a thickness of T1 and a flat insulating film 3 formed on the interconnection 2 to a thickness of T2. To form the insulating film 3 by using the CMP method, it is necessary to first deposit an insulating material to at least a thickness of T3 (=T1 +T2) indicated by a two-dot chain line in FIG. 20 and then to polish the deposition by a thickness (T3–T2) greater than T2. In other words, to flatten an insulating film by the CMP method, it is necessary to deposit an insulating material having a thickness of not less than twice as large as the thickness T1 of the interconnection 2 and to polish the insulating material by not less than the thickness T1.

In the meantime, according to the CMP method, polishing dispersion as high as not less than 10% of a polished amount (or thickness) might occur. It is therefore preferable to polish the deposition as little as possible for providing a flat surface.

However, if using an Al material for a interconnection layer, the thickness of the interconnection layer needs to be not less than, for example, 0.5 μm so that the interconnection layer can function as an electrode or a wiring. As described above, if the interconnection 2 is formed of Al material, the polished amount or thickness is increased, and more than 0.5 μm is necessary. Considering polishing dispersion, therefore, it is not favorable for the formation of a flat mirror-like surface.

Moreover, if forming a thin insulating film 3 on the interconnection 2 by the CMP method, the thickness of the film 3 tends to be uneven. This might be probably because the Al material for the interconnection as usually used is relatively soft and therefore force is exerted differently on portions where the interconnection 2 is present and portions where it is not present. From this, it is difficult to provide a completely flat surface.

As described above, according to the conventional technique, it has been quite difficult to make thin and completely flat mirror-like, interlayer insulating films and a passivation film formed above the interconnection of Al material having a thickness of not less than 0.5 μm.

Furthermore, in the recent semiconductor chips, to prevent erosion of an interconnection, a silicon nitride film (to be referred to as p-SiN) deposited on an uppermost layer by a plasma CVD (Chemical Vapor Deposition) method is used as a chip protection film.

FIG. 21 shows an enlarged typical view of important parts of such a semiconductor chip. Specifically, the semiconductor chip has a structure that a first interlayer insulating film 14, a second interlayer insulating film 16 and a third interlayer insulating film 18 are formed on a semiconductor substrate 10 made of silicon (Si) and having a source and drain for the formation of a MOS transistor buried therein, through a LOCOS 12 consecutively in due order. A first interconnection layer 22 connected to a lower gate electrode 20 through a contact hole is formed on the first interlayer insulating film 14. A second interconnection layer 24 is formed on the second interlayer insulating layer 16. A bonding pad 26 made of the exposed second interconnection layer 24 is formed in the opening of the uppermost third interlayer insulating film 18. The uppermost third interlayer insulating film 18 serves as a chip protection film for the semiconductor chip.

There are some cases where other components or devices are directly mounted on a chip to provide electric connection therebetween such as Si chip based liquid crystal display device in addition to ordinary connection by bonding using the above-described bonding pad 26, depending on intended uses.

However, if other components or devices are directly mounted on a chip to provide electric connection as described above, a problem occurs that a chip protection film cannot be formed on the uppermost interconnection layer as in the case of the semiconductor chip shown in FIG. 21.

SUMMARY OF THE INVENTION

The present invention has been made to solve the above conventional problems. It is therefore a first object of the present invention to provide a semiconductor device having a chip suited for mounting a liquid crystal on its surface and a manufacturing method thereof.

It is a second object of the present invention to form a thin, quite flat mirror-like insulating film on a uppermost interconnection layer.

It is a third object of the present invention to sufficiently protect the interior of the chip so that other components and devices can be directly mounted on the chip surface.

It is a fourth object of the present invention to provide a reflection type liquid crystal display device combined with the chip.

The present invention attains the first and second objects by making a semiconductor device having a chip provided by forming a plurality of insulating films and a plurality of interconnection layers on a semiconductor substrate, having a structure including an uppermost interlayer insulating film having a flat upper surface, a thin uppermost interconnection layer of thickness not more than 0.5 µm, made of hard material compared with Al or Al based alloy, having a predetermined pattern and formed on the flat upper surface of the uppermost interlayer insulating film, and a passivation film having a mirror-like flat surface and formed on the uppermost interconnection layer.

That is to say, a thin uppermost interconnection layer of titanium material having a predetermined pattern and harder than that of an Al material usually used as an interconnection material, is formed on the flat surface of an uppermost interlayer insulating film. As a result, an insulating material deposited on the uppermost interconnection layer can be made sufficiently thin and can be polished to have a mirror-like flat surface. Ti, Cr, Ni, Mo, W, Pt or a silicide thereof, or combination film of these and TiN formed thereon may be used as the material harder than Al material.

The first invention of the present invention can ensure the manufacture of the above semiconductor device by making a method of manufacturing the semiconductor device having a chip provided by forming a plurality of insulating films and a plurality of interconnection layers on a semiconductor substrate, comprising the steps of: forming an uppermost interlayer insulating film by flattening deposited insulating material; forming an uppermost interconnection layer having a predetermined pattern on a flat surface of the uppermost interlayer insulating film; and forming a thin uppermost insulating film having a mirror-like flat surface, on an entire substrate on the uppermost interconnection layer.

The second invention of the present invention attains the first and third objects by giving an uppermost interlayer insulating film right under an uppermost interconnection layer chip protection characteristics and by substantially exposing the uppermost interconnection layer to a chip surface by using a material having good erosion resistance as a material of the uppermost interconnection layer in a semiconductor device having a chip provided by forming a plurality of insulating films and a plurality of interconnection layers on a semiconductor substrate.

The chip protection characteristics means to protect the chip from external factors which may exert harmful influences upon semiconductor elements. The characteristics include (1) the protection film itself does not have pinholes, cracks or micro defects, (2) the protection film can prevent osmosis of water which may causes corrosion of wirings, especially made of Al or Al based alloy, (3) the protection film can prevent osmosis of alkali ions, especially of Na+ ion, which may cause deterioration of characteristics of transistors and so on formed in an interface of a semiconductor substrate. Silicon nitride film, silicon oxide nitride film formed by plasma CVD method and so on are used as the protection film having the above characteristics.

As a material of an uppermost interconnection layer, a material having stronger erosion resistance than that of Al—Si alloy or the like which is usually used as a wiring material can be used. An uppermost interlayer insulating film right under the uppermost interconnection layer is given chip protection characteristics for purposes of protecting the interior of the chip. While chip reliability is thus maintained, the uppermost interconnection layer can be substantially exposed to the chip surface and other components or devices can be directly mounted on and electrically connected to the chip.

The third invention of the present invention attains the fourth object by making a reflection type liquid crystal display device comprising a chip; and a reflection type liquid crystal unit provided on the chip and driven by the chip, wherein the chip comprising: an uppermost interlayer insulating film having a flat upper surface; an uppermost interconnection layer of thickness not more than 0.5 µm, made of harder material than Al or Al based alloy, having a predetermined pattern and formed on the flat surface of the uppermost interlayer insulating film; and a passivation film having a mirror-like flat surface and formed on the uppermost interconnection layer, or the chip comprising: an uppermost interlayer insulating film having a flat upper surface and chip protection characteristics; and an uppermost interconnection layer made of a material having good erosion resistance and formed on the flat surface of the uppermost interlayer insulating film.

These and other novel features and advantages of the present invention are described in or will become apparent from the following detailed description of the preferred embodiments.

BRIEF DESCRIPTION OF THE DRAWINGS

The preferred embodiments will be described with reference to the drawings wherein like elements have been denoted throughout the figures with like reference numerals, and wherein:

FIG. 8 is a partial cross-sectional view showing the step of forming a window opening for a bonding pad in the first embodiment according to the present invention;

DETAILED DESCRIPTION OF THE PREFERRED EMBODIMENTS

The embodiments of the present invention will be described hereinunder in detail with reference to the accompanying drawings.

According to a preferred embodiment of the present first invention, a thin, mirror-like flat uppermost insulating film serves as a passivation film. To make small the thickness difference of an uppermost interconnection layer formed thereunder, (1) the uppermost insulating film is flattened by the CMP method; (2) the upper interconnection layer is formed as a thin film having thickness not more than 0.5 μm and made of material harder than Al or Al based alloy.

When the CMP method is conducted to form the passivation film, a first insulating film, having a slower polishing speed than that of a second insulating film subjected to polishing, is deposited. The second insulating film is then deposited to a thickness of twice as large as the thickness of a thin conductive film made of the above material harder than Al. The second insulating film is polished by the CMP method using the first insulating film having a slower speed as a stopper.

When the CMP method is conducted, micro-defects are formed in the polished surface. To keep the insulation of the passivation film, a thin insulating film is further deposited on the passivation film. If the passivation film is formed in this manner, die bonding cannot be conducted to the uppermost interconnection layer. Taking this into consideration, a bonding pad is formed by leading the lower interconnection layer.

An embodiment according to the present first invention which is applied to a four-layer interconnection will be described in more detail with reference to the drawings.

It is noted that the present invention is characterized by the multilayer structure of a chip in the semiconductor device and therefore description centers around the steps of forming the wiring relevant to this. In this embodiment, a MOS type semiconductor device will be illustrated. However, the present invention should not limited thereto.

Figure 1:
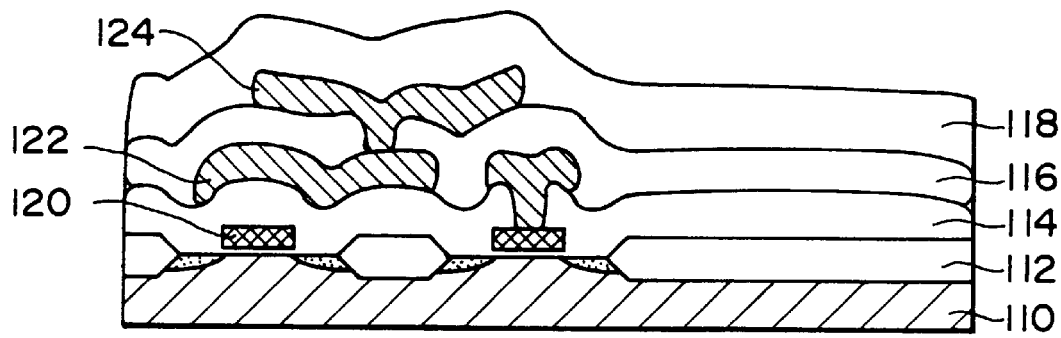
FIG. 1 is a partial cross-sectional view showing manufacturing steps until a third interlayer insulating film is formed in a first embodiment according to the present invention.

FIGS. 1 through 8 are partial cross-sectional views for describing the method of manufacturing a semiconductor chip of the first embodiment according to the present first invention. FIG. 1 illustrates that a first interlayer insulating film 114, a second interlayer insulating film 116 and a third interlayer insulating film 118 are consecutively formed in due order through a LOCOS 112 on an Si semiconductor substrate 110 wherein a source, a drain and the like for constituting elements are embedded. A first interconnection layer 122 and a second interconnection layer 124 are formed on the first interlayer insulating film 114 having a gate electrode 120 formed on the lower part thereof through a via hole and the second interlayer insulating film 116, respectively. FIG. 1 shows steps until the third interlayer insulating film 118 is deposited.

More specifically, the first interlayer insulating film 114 consists of two layers of NSG (Non-doped Silicate Glass) and BPSG (Boron Phosphorous Silicate Glass) (both not shown). The second and third interlayer insulating films 116 and 118 are silicon oxide films made of TEOS (Tetra Ethyl Ortho Silicate) by the plasma CVD (which will be referred to as p-TEOS hereinafter). The gate electrode 120 is made of polysilicon (to be referred to as p-Si hereinafter). The first and second interconnection layers 122 and 124 are made of Al material, i.e., Al—Si alloy (though not limited to Al—Si alloy).

Figure 2:
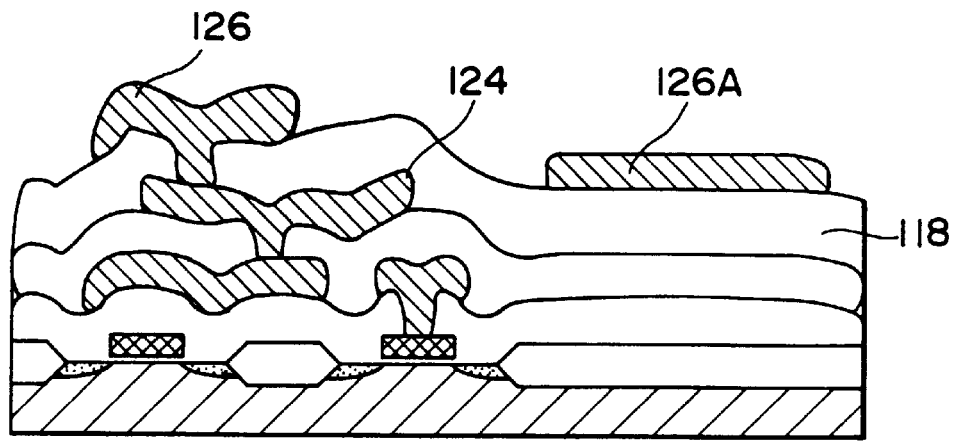
FIG. 2 is a partial cross-sectional view showing the step of forming a third interconnection in the first embodiment according to the present invention.

As shown in FIG. 2, a third metal layer made of, for example, Al—Si alloy is deposited on the third interlayer insulating film 118. The third metal layer is patterned by an appropriate method to thereby form a third interconnection layer 126. The third interconnection layer 126 has a thickness of, for example, 0.5 μm sufficient for bonding since a part of the layer 126 is used as a bonding pad 126A. Until the state shown in FIG. 2, the ordinary manufacturing method is conducted.

Figure 3:
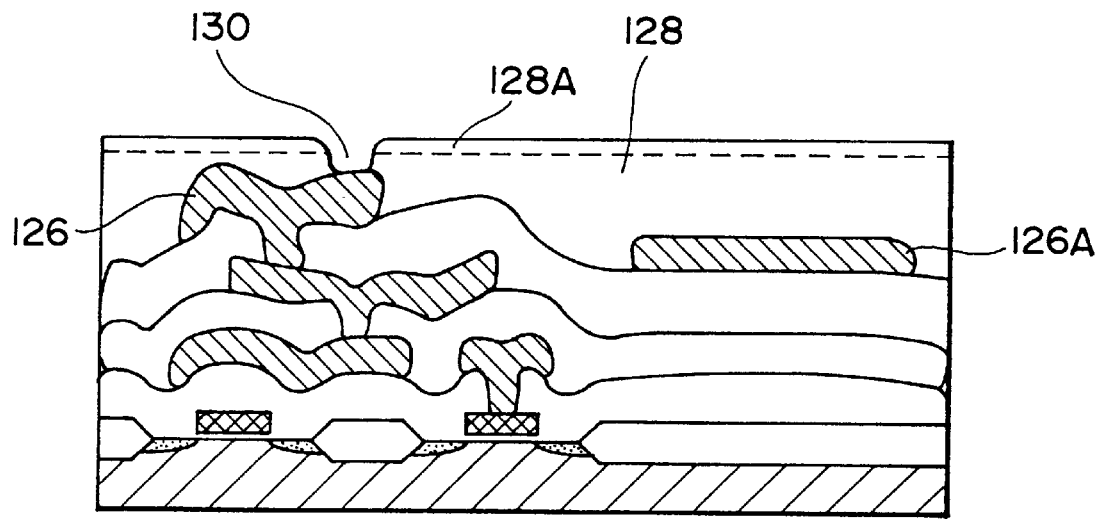
FIG. 3 is a partial cross-sectional view showing the steps of forming the fourth (or uppermost) interlayer insulating film, flattening the film surface and forming a via hole in the first embodiment according to the present invention.

Next, a fourth interlayer insulating film (or an uppermost interlayer insulating film) 128 is formed as shown in FIG. 3. The film 128 can be formed by any method. For example, p-TEOS (not shown) is deposited to a thickness of 1.4 μm and a thick silicon oxide film is polished by using the CMP method by 0.7 μm to a thickness as indicated by a broken line shown in FIG. 3. An insulating film 128A made of p-TEOS is further deposited to a thickness of 0.2 μm to coat micro-defects caused by conducting the CMP method, thereby forming the fourth interlayer insulating film 128 having a flat surface. Thereafter, using the ordinary method, a via hole 130 is formed as shown in FIG. 3.

It should be noted that the via hole is not formed on the fourth interlayer insulating film 128 in a region (right of FIG. 3) where the bonding pad 126A of the third interconnection layer 126 is formed. In some cases, a via hole may be formed in the region of the bonding pad 126A. Since a thickness difference in a large region is undesirable for flattening the passivation film later formed by the CMP method, a via hole is not formed in that region in this embodiment.

Figure 4:
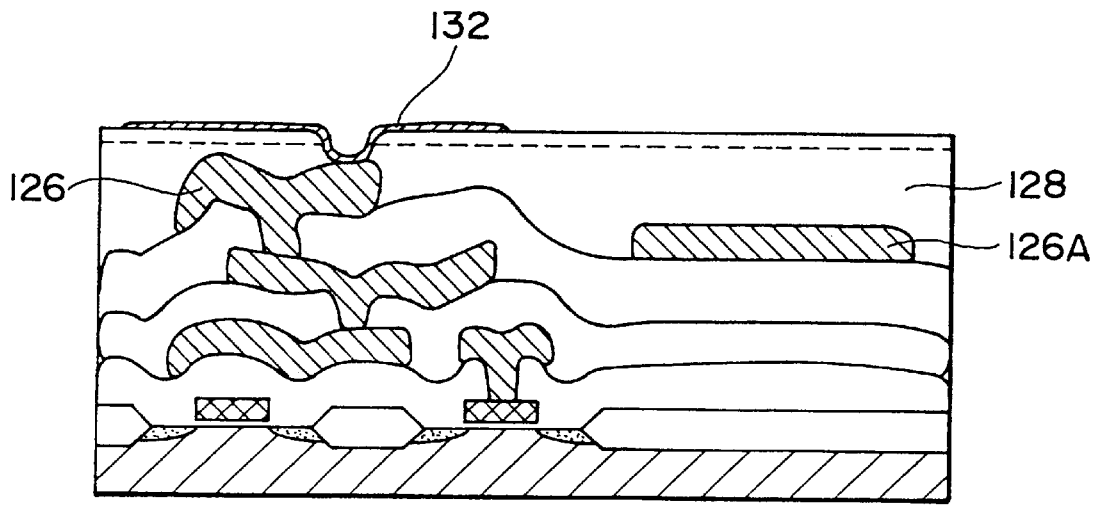
FIG. 4 is a partial cross-sectional view showing the step of forming a fourth (or uppermost) interconnection layer in the first embodiment according to the present invention.

To form a fourth interconnection layer (or an uppermost interconnection layer), after a Ti film (Ti is harder than Al material) is deposited on the resultant substrate to a thickness of 0.03 μm and a TiN film is deposited on the Ti film to a thickness of 0.1 μm, the films are patterned in an appropriate method. Thus, as shown in FIG. 4, a fourth interconnection layer 132 electrically connected to the third interconnection layer 126 is formed. Since TiN/Ti films are not suited for bonding, part of the films provided above the bonding pad 126A are etched away.

Figure 5:
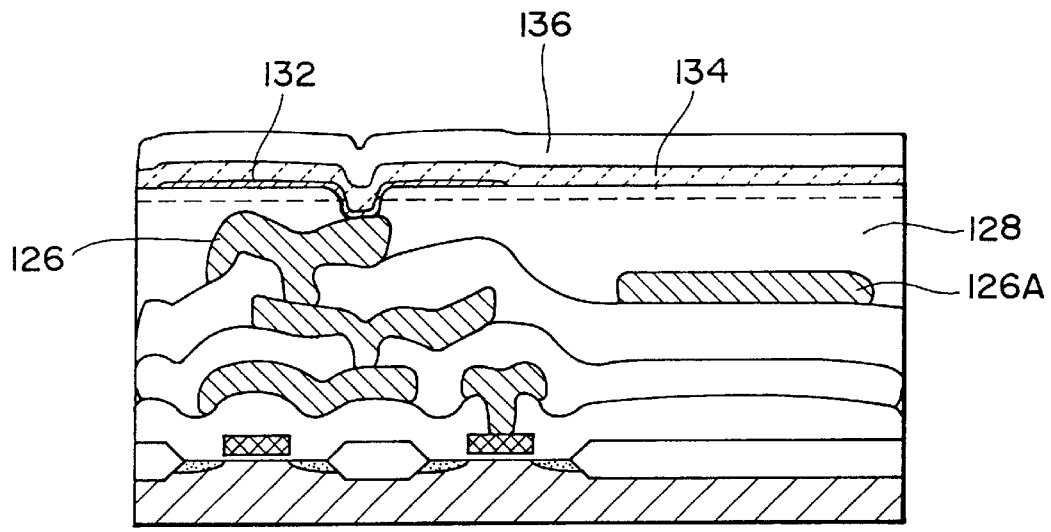
FIG. 5 is a partial cross-sectional view showing the steps of forming first and second insulating films in the first embodiment according to the present invention.

Next, a passivation film serving as a thin uppermost insulating film having a mirror-like flat surface is formed. To do this, a silicon nitride film formed by the plasma CVD (to be referred to as p-SiN) is deposited as a first insulating film 134, to a thickness of 0.3 μm and a p-TEOS film is deposited thereon as a second insulating film 136 to a thickness of approximately 0.4 μm as shown in FIG. 5.

Figure 6:
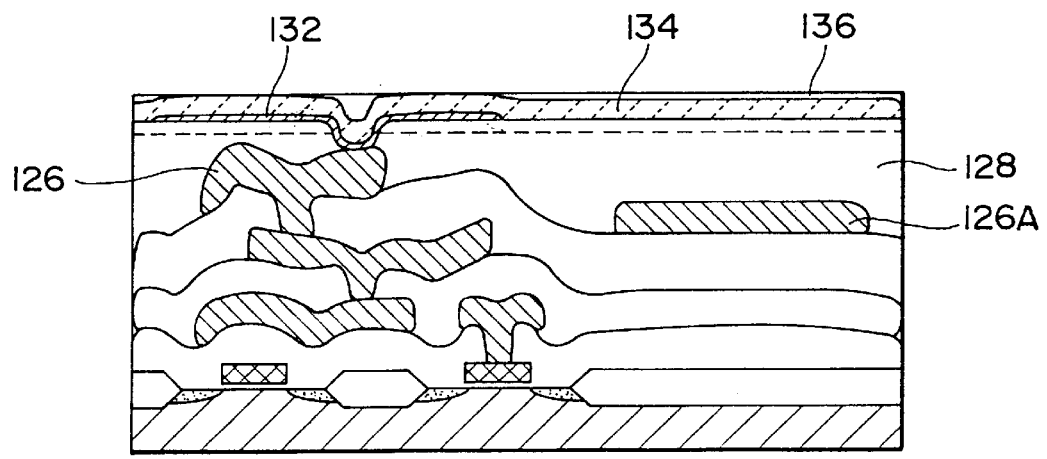
FIG. 6 is a partial cross-sectional view showing the step of polishing the second insulating film in the first embodiment according to the present invention.

The p-TEOS film is then polished by, for example, 0.5 μm by the CMP method to thereby bury the recessed part of the first insulating film 134 and to leave substantially no second insulating film 136 on the flat surface above the fourth interconnection layer 132 as shown in FIG. 6. Since the p-SiN first insulating film 134 is polished by the CMP at not more than half a speed of that of the p-TEOS film in this step, the first insulating film 134 can function as a polishing stopper. With the presence of the stopper, it is possible to form a flat surface mainly made of p-SiN having a thickness of approximately 0.3 μm by the CMP method in a stable manner.

Figure 7:
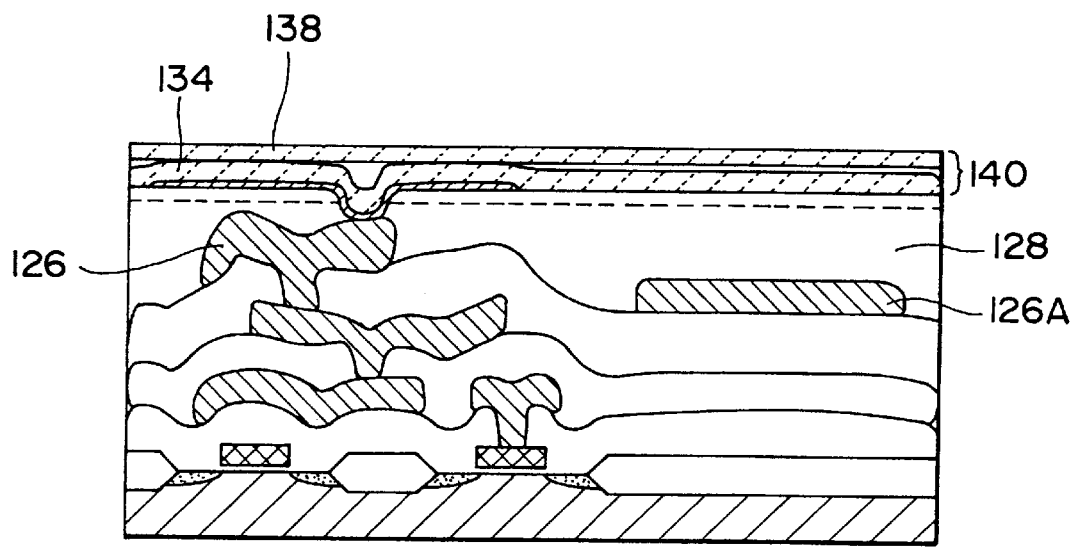
FIG. 7 is a partial cross-sectional view showing the step of forming a third insulating film in the first embodiment according to the present invention.

Thereafter, as shown in FIG. 7, a p-SiN film serving as a third insulating film 138 is deposited to a thickness of 0.2 μm to thereby coat micro-defects caused by conducting the CMP and to protect the resultant substrate. Thus, a passivation film 140 is formed.

As a result of the above procedures, a thin passivation film 140 made of substantially only p-SiN and having a completely flattened mirror-like surface and a thickness of approximately 0.5 μm can be formed. The dielectric constant of the silicon oxide film is approximately 3.9 and that of the silicon nitride film is approximately 7.5. They are converted into an oxide film thickness of approximately 0.5 μm×3.9/7.5=0.26 μm. Which means that a thin passivation film having a film thickness of approximately 0.26 μm is formed.

As shown in FIG. 8, an opening is formed on the bonding pad 126A. The opening can be formed by etching away the p-SiN film serving as the third insulating film 138, the p-TEOS film as the second interlayer insulating film 136, the p-SiN film as the first insulating film 134 and the p-TEOS film as the fourth interlayer insulating film 128 in due order. The first insulating film 134 of the bonding pad portion is recessed a little during deposition and the p-TEOS film might remain on the portion even after the CMP method is conducted. For that reason, the p-TEOS film is etched away, as well. As in the case of preceding figures, a mesh portion denotes a cross-section in FIG. 8.

As described above, according to the first embodiment of the present invention, harder material than Al material is used as the uppermost interconnection layer, so that deformation of the uppermost interconnection layer during the CMP is prevented from occurring. Consequently, a thin, mirror-like flat passivation film 140 can be formed in a stable manner. Therefore, if a capacitor using, for example, the fourth interconnection layer 132 as one electrode is formed on the passivation film 140, the distance between electrodes of the capacitor can be narrowed and uniformity can be maintained in the plane direction, thus making it possible to provide a high-precision capacitor. In addition, if the mirror-like flat surface of the passivation film 140 is used as a light reflection surface, perfect mirror reflection can be realized.

In the first embodiment, TiN/Ti film is used as the uppermost interconnection layer. But material for the film is not limited to TiN/Ti, and Ti, Cr, Co, Ni, Mo, W, Pt or silicides thereof, or combined film with these and TiN formed thereon may be used.

Although the above embodiment refers to specific dimensions, the present invention should not be limited thereto but other dimensions can be used in the present invention. Preferably, the thickness of the passivation film 140 is not more than 0.6 μm. Likewise, thicknesses of the first insulating film 134, the second insulating film 136 and the third insulating film 138 for providing the passivation film 140 are preferably not more than 0.4 μm, between 0.2 and 0.5 μm and between 0.1 and 0.3 μm, respectively.

The thickness of the TiN/Ti fourth interconnection layer 132 is preferably 0.1 to 0.2 μm in total. At this case, the thickness of the TiN film is preferably 0.07 to 0.15 μm and that of the Ti is preferably 0.02 to 0.05 μm.

The thickness of the passivation film 140 is preferably not more than 0.3 μm when converted into a oxide film thickness based on dielectric constant.

The first invention has been described so far with reference to the first embodiment in detail. However, the first invention should not be limited to the above first embodiment. Various modifications are possible without departing the spirit and scope of the present first invention.

For example, the first present invention has been described with reference to the passivation film in the first embodiment. However, it is possible to center around an interlayer insulating film. In such a case, a high-precision capacity element can be formed by mounting electrodes on the interlayer insulating film.

An embodiment according to the second present invention will now be described in detail.

FIGS. 9 through 18 are cross-sectional views of important parts of a semiconductor chip in the second embodiment according to the present invention, showing characteristics of steps of manufacturing the semiconductor chips in the order of the steps. The steps will be described consecutively with reference to FIGS. 9 through 18.

Figure 9:
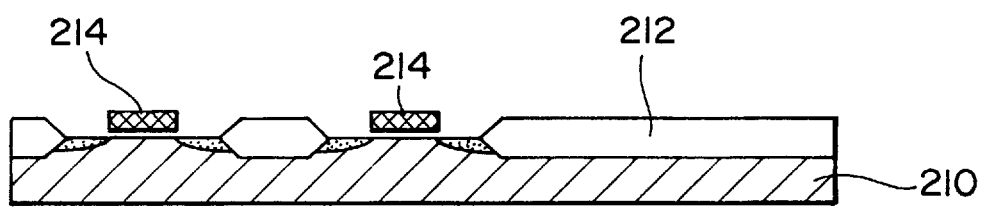
FIG. 9 is a partial cross-sectional view showing the step of forming a MOS transistor in a second embodiment according to the present invention.
Figure 21:
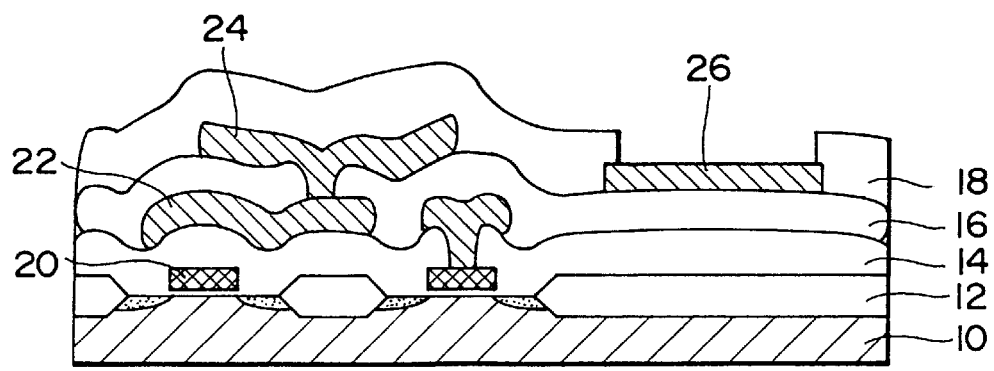
FIG. 21 is a partial cross-sectional view showing important parts of the conventional semiconductor device.

As shown in FIG. 9, a MOS transistor is formed on a silicon (Si) semiconductor substrate 210 in an ordinary step. The step is substantially the same as that in the case of the conventional semiconductor chip manufacturing process shown in FIG. 21. A LOCOS 212 is formed on the semiconductor substrate 210 and a gate electrode 214 made of polysilicon (p-Si) is formed on a gate oxide film between a source and a drain.

Figure 10:
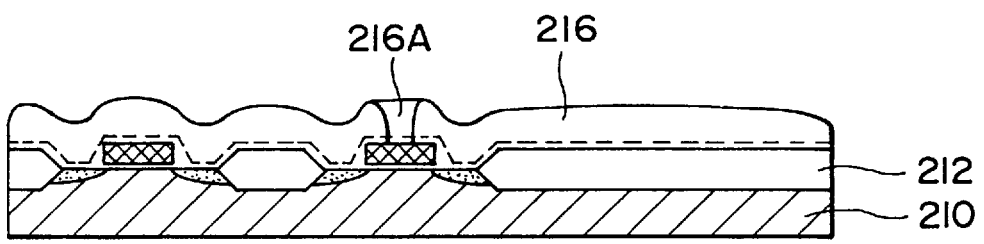
FIG. 10 is a partial cross-sectional view showing the step of forming a first interlayer insulating film in the second embodiment according to the present invention.

As shown in FIG. 10, an NSG (Non Silicate Glass) of, for example, 1000 to 2000 Å as indicated by a broken line and a BPSG (Boron Phosphorous Silicate Glass) of, for example, 4000 to 8000 Å are consecutively deposited to form a first interlayer insulating film 216. Annealing is conducted at, for example, 900 to 950° C. for 20 to 60 minutes to reduce the thickness difference before a contact hole 216A is formed in the first interlayer insulating film 216.

Figure 11:
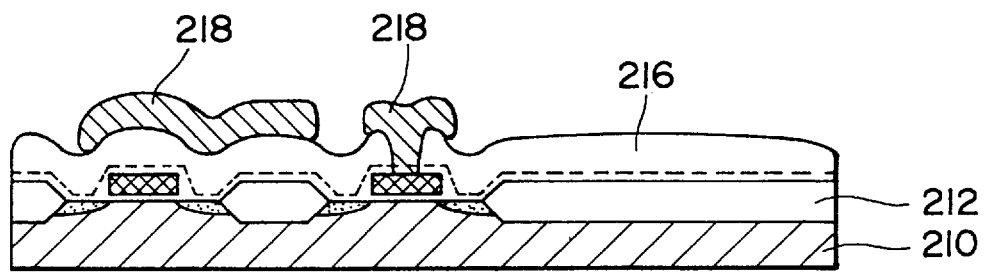
FIG. 11 is a partial cross-sectional view showing the step of forming a first interconnection layer in the second embodiment according to the present invention.

As shown in FIG. 11, a first interconnection layer 218 is formed by, for example, depositing an Al—Si alloy layer on the first interlayer insulating film 216 to a thickness of 0.4 to 1.0 μm by the sputtering method and by patterning the Al—Si alloy layer by the well-known method.

Figure 12:
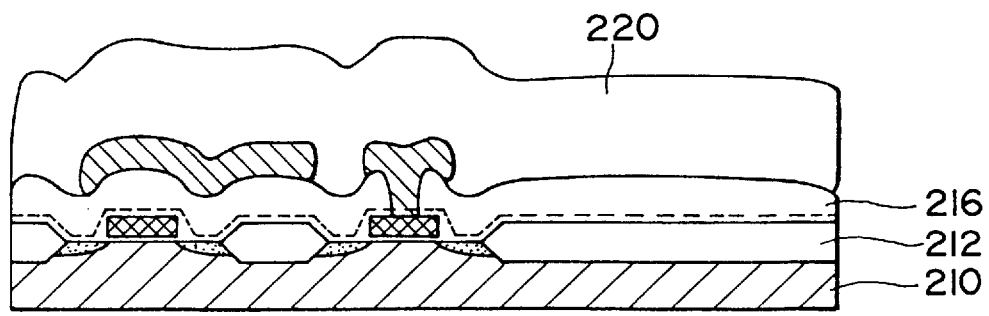
FIG. 12 is a partial cross-sectional view showing the step of depositing a p-TEOS film for the formation of a second interlayer insulating film in the second embodiment according to the present invention.
Figure 13:
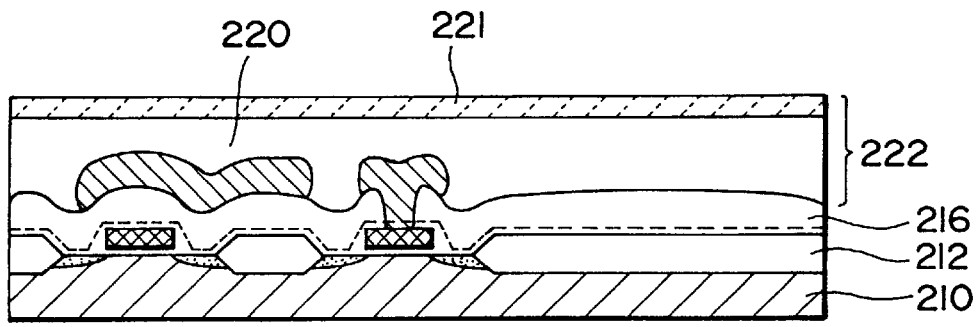
FIG. 13 is a partial cross-sectional view showing the step of forming a chip protection film on the flat surface of the second interlayer insulating film in the second embodiment according to the present invention.

A second interlayer insulating film is then formed. To do so, as shown in FIG. 12, a silicon oxide film 220 made of TEOS (Tetra Ethyl Ortho Silicate) is deposited by the plasma CVD method to a thickness of approximately 1.0 to 2.0 μm. (The deposited film 220 will be referred to as a p-TEOS film hereinafter). The p-TEOS film 220 is polished by approximately 0.5 to 1.0 μm by the CMP (Chemical Mechanical Polishing) method to thereby flatten the surface of the p-TEOS film 220. (The state of the surface shortly after being flattened is not shown in FIG. 12). The flattening of the surface of the p-TEOS film 220 is conducted to ensure that other devices or the like are bonded onto the finished chip and connected electrically thereto.

Thereafter, a p-SiN film serving as a chip protection film 221 is deposited on the p-TEOS film 220 to a thickness of approximately 0.2 to 0.8 μm, thus forming a second interlayer insulating film (or uppermost interlayer insulating film) 222 of two-layer structure consisting of the p-TEOS film 220 and the chip protection film 221. The deposited p-SiN is widely used as a chip protection film for an ordinary semiconductor chip.

Clearly from the above, the chip protection film 221 is formed of p-SiN, by which the chip portion provided below the film 221 is protected. That is, the second interlayer insulating film can provide chip protection by forming the chip protection film 221.

Figure 14:
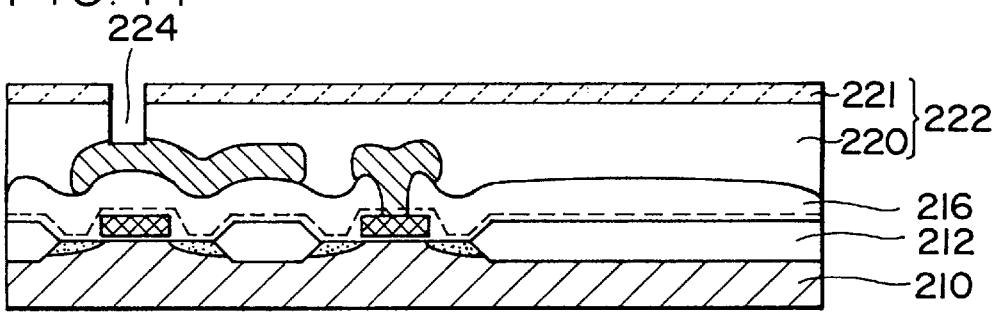
FIG. 14 is a partial cross-sectional view showing the step of forming a via hole in the second interlayer insulating film in the second embodiment according to the present invention.

Next, as shown in FIG. 14, a via hole 224 is formed in a predetermined position to go through the second interlayer insulating film 222 and then to reach the first interconnection layer 218.

Figure 15:
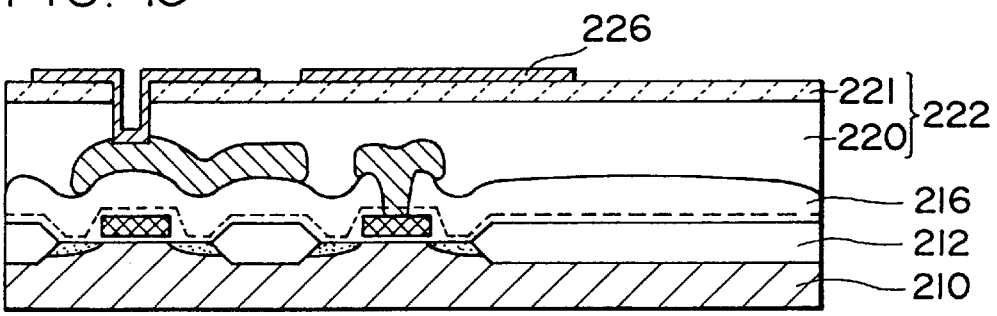
FIG. 15 is a partial cross-sectional view showing important parts of the semiconductor chip in the second embodiment according to the present invention.

As shown in FIG. 15, a second interconnection layer (or uppermost interconnection layer) 226 is formed. To do so, a titanium (Ti) film with a thickness of approximately 0.02 to 0.1 μm and then a titanium nitride (TiN) film with a thickness of approximately 0.05 to 0.20 μm are deposited on the entire surface of the second interlayer insulating film 222 as well as the interior of the via hole 224. The conductive film of two-layer TiN/Ti structure thus formed is patterned by the well-known method.

In this embodiment, the second interconnection layer 226 is exposed. The reason the TiN/Ti conductive film is used for the wiring exposed to the chip surface is that the TiN/Ti conductive film is superior to an Al—Si alloy film or the like in resistance to erosion.

FIG. 15 shows the state that the second interconnection layer 226 has been formed. As a result, the second interconnection layer 226 and the first interconnection layer 218 are electrically connected to each other. In the case of an ordinary semiconductor chip, an insulating film serving as a protection film such as p-SiN film is formed on the second interconnection layer 226 serving as the uppermost interconnection layer. In this embodiment, however, such a protection film is not formed.

As described in detail so far, in this embodiment, the second interconnection layer 226 made of material having excellent erosion resistance is formed and the second interlayer insulating film 222 provided right under the layer 226 is given the chip protecting function. This ensures that the interior of the chip is protected and that erosion is prevented even if the second interconnection layer 226 is exposed to the chip surface. Consequently, the reliability of the semiconductor device can be maintained and other components or devices can be directly mounted on and electrically connected to the chip. As a device (or component) directly mounted on the chip, there is a liquid crystal mounted as the second interconnection layer 226 to be electrodes through a dielectric reflection film.

Therefore, according to this embodiment, other components or devices can be directly mounted on and electrically connected to the chip, and a semiconductor device excellent in erosion resistance and having high reliability can be provided.

In the second embodiment, two layer film consisting of Ti and TiN formed thereon is used as material for the uppermost interconnection layer. But, material for the layer is not limited to TiN/Ti, or other material may be used.

Corrosions are roughly classified into dry corrosion (mainly oxidation) and corrosion by water solution. Easiness to oxidation of metal is estimated by free energy for making oxide. The less negative the free energy of a metal is, the easier the metal is oxidized. Ti, Cr, Co, Ni, Mo, Ag, W, Pt, Au and so on have larger value of the free energy than Al, and they are not easily oxidized. Corrosion by water solution is caused by elution of metallic atom as an ion. When two kinds of metals are placed in an electrolyte and electrically connected, anode side metal is inonized and moves to cathode side, electrons generated at the anode side by ionization move to the cathode side through external connection and generate OH-ions by deoxidization of hydrogen ions. Work load to transfer electrons from anode to cathode equals to change in free energy ΔG accompanied with this reaction. The change in free energy ΔG is proportional to normal electrode potential E. The more a metal is similar to anode, the easier the metal is corroded. Ti, Cr, Co, Ni, Mo, Ag, W, Pt, Au and so on have smaller values of E, which indicates ionization tendency, than that of Al and they are not easily corroded. Therefore, these metals may be used as the incorrodible material of the second embodiment. Soft metals as Ag or Au may be used in the second embodiment, because, different from the first embodiment, the CMP method is not applied in the second embodiment after the uppermost interconnection layer is formed. As TiN and W are highly resistent to corrosion, wiring made of the other metals like Al or Al based alloy may be used by covering at least a top surface thereof with TiN or W.

A third embodiment according to the present second invention will next be described.

Figure 16:
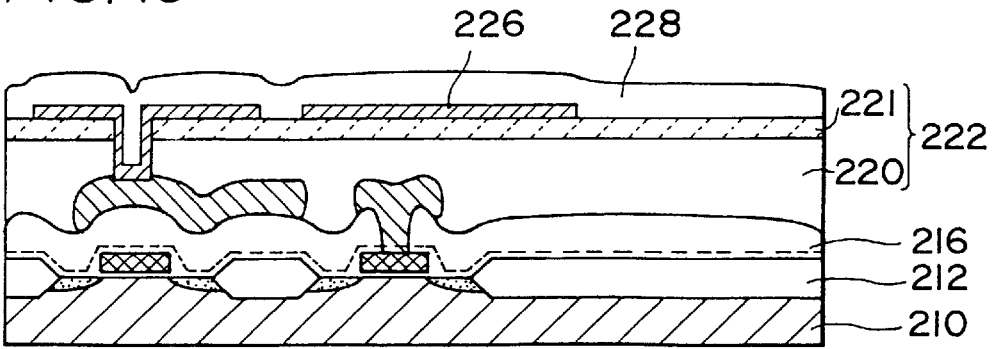
FIG. 16 is a partial cross-sectional view showing one manufacturing step in a third embodiment according to the present invention.

FIG. 16 is a partial cross-section view showing one step of manufacturing a semiconductor chip of the third embodiment. Specifically, the cross-sectional view illustrates a step of forming an ordinary insulating film 228 made of silicon oxide on the second interconnection layer 226 of the second embodiment by the well-known method.

Figure 17:
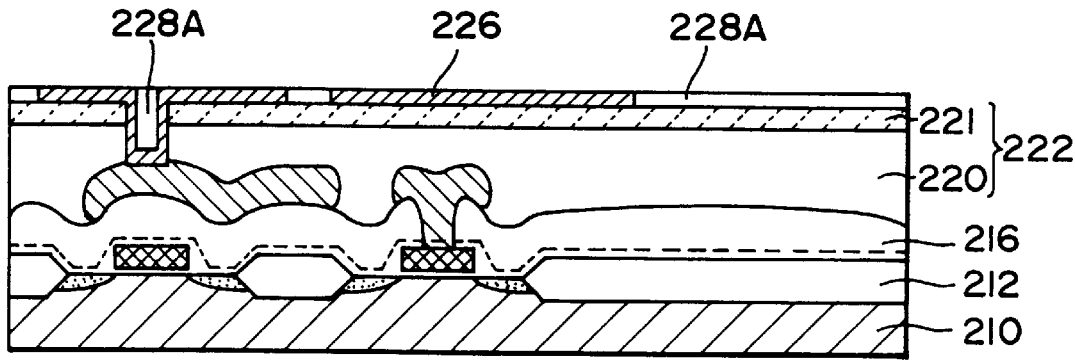
FIG. 17 is a partial cross-sectional view showing important parts of a semiconductor device in the third embodiment according to the present invention.

After the above step, the insulating film 228 is etched back by the well-known method so as to have substantially the same height of the second interconnection layer 226. The thickness difference resulting from the patterning of the second interconnection layer 226 is relieved by flattening the layer 226 by using a remaining insulating layer 228A. Thus, a semiconductor chip of the third embodiment having a cross-sectional shape as shown in FIG. 17 is provided.

In this embodiment, the insulating film 228A is not basically remained on the second interconnection layer 226 except on the via hole 224. In this case, however, only if electrical connection can be established between the chip and other devices or the like, the insulating film 228A may remain a little on the second interconnection layer 226.

Figure 18:
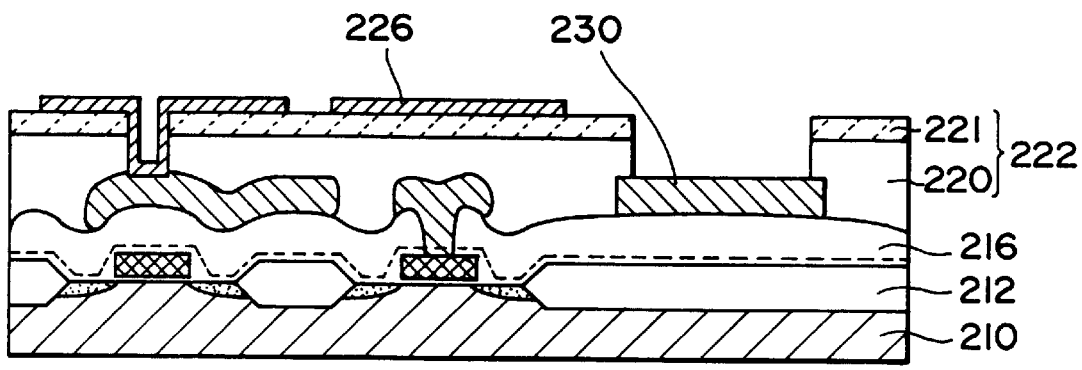
FIG. 18 is a partial cross-sectional view showing important parts of a semiconductor device in a fourth embodiment according to the present invention.

FIG. 18 is a partial cross-sectional view showing the structure of important parts of a semiconductor chip of the fourth embodiment according to the present second invention. The semiconductor chip shown therein has a structure that a bonding pad 230 is added to the semiconductor chip described in the second embodiment shown in FIG. 15. It is noted that a meaning of mesh portions used in a cross-sectional view in FIG. 18 is shown.

As in the case of the second embodiment, this embodiment is designed to have direct electrical connection between the chip and the external devices by exposing the uppermost interconnection layer to the surface. In this embodiment, it is also possible to use a wire-bonding method as in the case of ordinary chips. In the latter case, when a lower first interconnection layer is formed, a metal layer for the bonding pad is also formed and an opening is formed in a second interlayer insulating film 222 provided above the metal layer to thereby form a bonding pad 230. This is because it is difficult to make a bonding to the TiN/Ti film forming the second or uppermost interconnection layer 226.

The second present invention has been described in detail so far. However, the present second invention should not be limited to the second through fourth embodiments. Various modifications can be made without departing the spirit and the scope of the invention.

For example, the embodiments described above illustrate that a p-TEOS film 220 constituting the second interlayer insulating film 222 is flattened by the CMP method. However, the present invention should not be limited thereto and polishing process can be omitted.

In addition, the above embodiments illustrate that the surface of the chip is covered with the chip protection film 221 so that the second interlayer insulating film 222 can protect the chip. Instead, the entirety of the second interlayer insulating film 222 may be formed of a chip protecting material.

A fifth embodiment according to the present third invention will next be described in detail.

Figure 19:
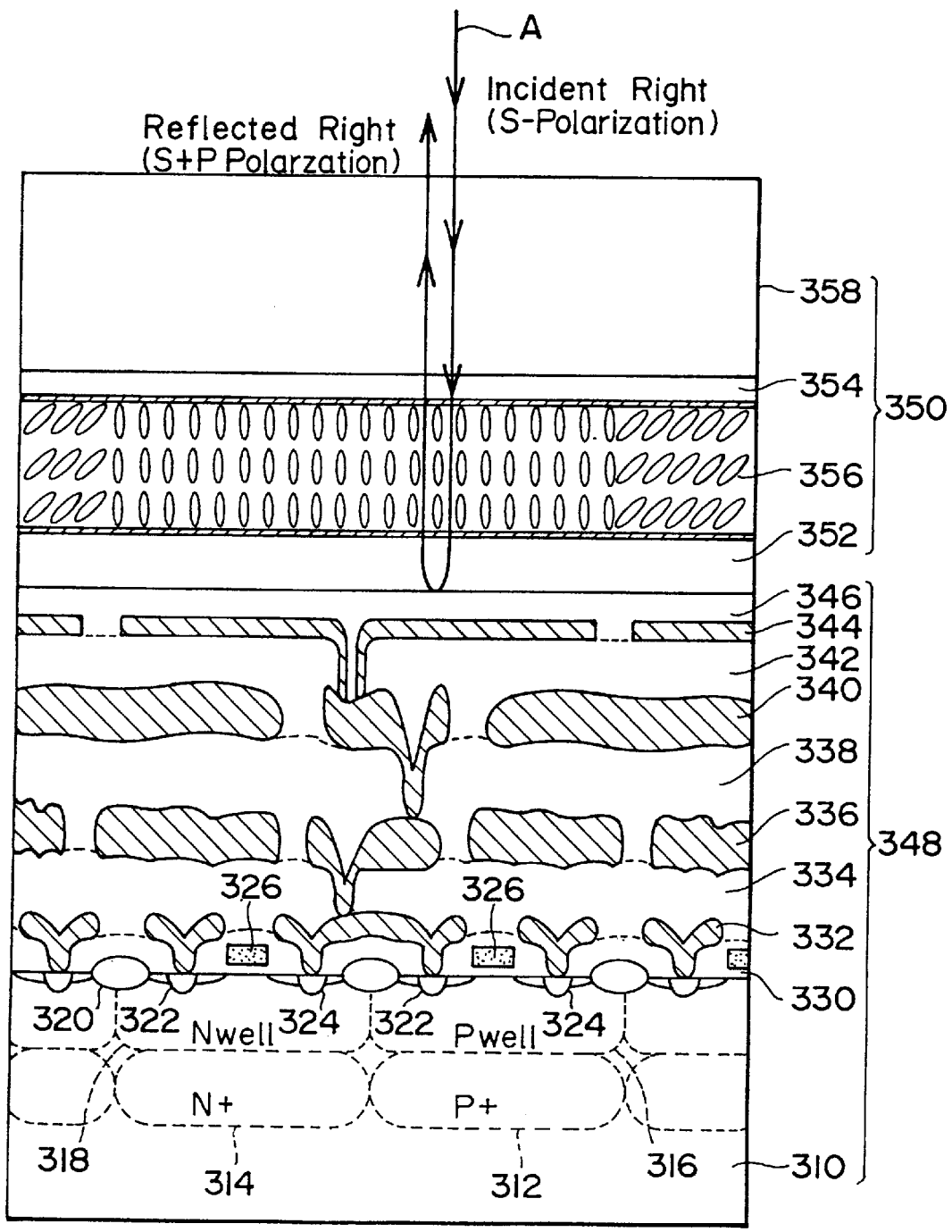
FIG. 19 is a partial cross-sectional view showing important parts of a reflection type liquid crystal display device in a fifth embodiment according to the present invention.
Figure 20:
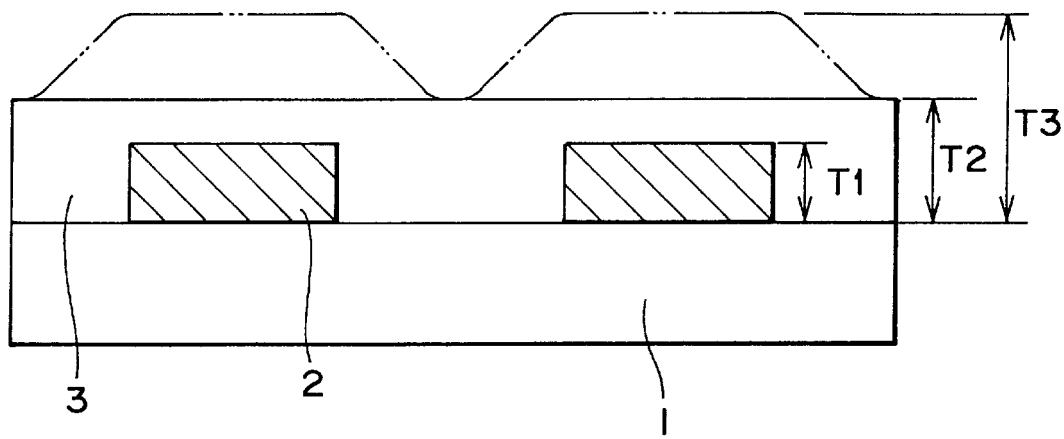
FIG. 20 is a partial cross-sectional view for describing problems of the conventional method.

FIG. 19 is a cross-sectional view showing the structure of a reflection type liquid crystal display device of the fifth embodiment. In this embodiment, a P+ buried region 312 and an N+ buried region 314 are formed in a P-type silicon semiconductor substrate 310 by burying-epitaxial growth method, for example. A P well 316 and an N well 318 are formed on the P+ buried region 312 and the N+ buried region 314, respectively. The P well 316 and the N well 318 are separated by a LOCOS 320, for example. A source region 322, a drain region 324 and a gate electrode 326 are formed on each of the P well 316 and the N well 318, whereby high withstand voltage transistors are formed in a matrix.

A first interconnection layer 332 made of, for example, aluminum (Al) material is formed on the first interlayer insulating film 330 covering the transistors. A second interconnection layer 336 made of, for example, Al material is formed on a second interlayer insulating film 334 covering the first interconnection layer 332. A third interconnection layer 340 made of, for example, Al material is formed on a third interlayer insulating film 338 covering the second interconnection layer 336. The surface of a fourth interlayer insulating film (or uppermost interlayer insulating film) 342 is polished and flattened by the CMP method according to the present first invention and chip protection is ensured according to the present second invention. A fourth interconnection layer (or uppermost interconnection layer) 344 made of, for example, TiN/Ti material is formed on the fourth interlayer insulating layer 342 according to the present second invention. The fourth interconnection layer 344 serves as a pixel electrode layer for a liquid crystal disposed on the chip. A chip protection film (corresponding to the uppermost insulating film in the present first invention) 346 may be formed on the fourth interconnection layer 344.

The chip protection film can be dispensed with as in the second embodiment, because TiN is highly resistant to corrosion. Further, as in the third embodiment, an insulating film made of silicon oxide and so on may be deposited after the uppermost interconnection layer 344 is formed, the insulation film is removed until substantially the same height of that of the uppermost interconnection layer so as to form the insulating film between the uppermost interconnections, to thereby flatten a chip surface.

The semiconductor substrate 310 through the chip protection film 346 (or the fourth interconnection layer 344 in case the chip protection film 346 is not formed) thus constitute a liquid crystal driving chip 348. A liquid crystal unit 350 is disposed on the chip 348.

More specifically, the liquid crystal unit 350 consists of a dielectric reflection film 352 having a flat reflection surface for reflecting incident light and formed on the mirror-like flat surface of the protection film 346 (or the fourth interconnection layer 344) of the chip 348, a transparent electrode 354 provided above the reflection film 352 through a predetermined space, a liquid crystal 356 put between the dielectric reflection film 352 and the transparent electrode 354 and a liquid crystal protection glass 358 provided on the transparent electrode 354.

For example, titanous oxide formed by electron beam vaporization method may be used as the dielectric reflection film 352. The titanous oxide is suitable for use as reflection film of light, because it is high in refractive index. However, it has no function as chip protection film, because it is porous and low in insulation property.

In the liquid crystal display device of this embodiment, when incident light of S polarization passing through the surface of the glass 358 in the direction of arrow A reflects on the mirror-like flattened surface of the dielectric reflection film 352 and returns in the arrow direction, the intensity of the reflection light of S+P polarization can be controlled by changing the configuration of the liquid crystal. The liquid crystal configuration can be changed by changing driving states for each of matrix transistors formed on the chip for every pixel.

Structures and functions of components other than the chip 348 employing the first and second inventions are the same as those of the well-known Si chip based liquid crystal. Detailed description thereto will not be therefore given herein.

In this embodiment, the first and second inventions are applied to a reflection type liquid crystal display. However, applications of the first and second inventions should not be limited to the reflection type liquid crystal display.

It should be apparent to those skilled in the art that the above-described embodiments are merely illustrative which represent the applications of the principles of the present invention. Numerous and varied other arrangements can be readily devised by those skilled in the art without departing from the spirit and the scope of the invention.

What is claimed is:

1. A semiconductor device comprising a chip including a plurality of insulation films and interconnection layers alternately formed on a semiconductor substrate, wherein:

at least a portion of an uppermost interlayer insulation film directly under an uppermost interconnection layer comprises one of silicon nitride and silicon oxynitride;

at least a top surface of the uppermost interconnection layer comprises Ti, Cr, Ni, Mo, Ag, W, Pt, Au or TiN;

a second interconnection layer directly under the uppermost interlayer insulation film comprises aluminum or an aluminum alloy; and a bonding pad is formed by removing the uppermost interconnection layer and the uppermost interlayer insulation film over the second interconnection layer, such that the uppermost interconnection layer is substantially exposed to a chip surface.

2. A semiconductor device according to claim 1, wherein the uppermost interconnection layer comprises a layer consisting of one of aluminum and an aluminum alloy and a layer consisting of one of titanium nitride and tungsten.

3. A semiconductor device according to claim 2, wherein the uppermost interlayer insulating film comprises a substantially flat surface directly under the uppermost interconnection layer.

4. A semiconductor device according to claim 1, wherein the uppermost interconnection layer comprises a titanium layer and a titanium nitride layer formed on the titanium layer.

5. A semiconductor device according to claim 4, wherein the uppermost interlayer insulating film comprises a substantially flat surface directly under the uppermost interconnection layer.

6. A semiconductor device according to claim 5, wherein the titanium nitride layer has a thickness of from 0.07 to 0.15 $\mu$m, the titanium layer has a thickness of from 0.02 to 0.05 $\mu$m, and the total thickness of the titanium nitride layer and the titanium layer is from 0.1 to 0.2 $\mu$m.

7. A semiconductor device according to claim 4, wherein the titanium nitride layer has a thickness of from 0.07 to 0.15 $\mu$m, the titanium layer has a thickness of from 0.02 to 0.05 $\mu$m, and the total thickness of the titanium nitride layer and the titanium layer is from 0.1 to 0.2 $\mu$m.

8. A semiconductor device according to claim 1, wherein the uppermost interlayer insulating film comprises a substantially flat surface directly under the uppermost interconnection layer.

9. A semiconductor device according to claim 8, wherein an insulation film is deposited on the uppermost interconnection layer and on the uppermost interlayer insulation film directly under the uppermost interconnection layer, the insulation film is then removed until the insulation film has substantially the same height as the uppermost interconnection layer, such that a chip surface is flat.

10. A semiconductor device according to claim 1, wherein an insulation film is deposited on the uppermost interconnection layer and on the uppermost interlayer insulation film directly under the uppermost interconnection layer, the insulation film is then removed until the insulation film has substantially the same height as the uppermost interconnection layer, such that a chip surface is flat.

11. A reflection type liquid crystal display device, comprising:
a chip; and
a reflection type liquid crystal unit provided on, and driven by, the chip;
wherein the chip including:
an uppermost interlayer insulating film having a substantially flat upper surface, at least a portion of the uppermost interlayer insulation film comprises one of silicon nitride and silicon oxynitride; and
at least a top surface of an uppermost interconnection layer formed on the substantially flat upper surface of the uppermost interlayer insulating film comprises Ti, Cr, Ni, Mo, Ag, W, Pt, Au or TiN, and
a second interconnection layer directly under the uppermost interlayer insulation film comprises aluminum or an aluminum alloy; and
a bonding pad formed by removing the uppermost interconnection layer and the uppermost interlayer insulation film over the second interconnection layer.

12. A reflection type liquid crystal display device according to claim 11, wherein the uppermost interconnection layer comprises a layer consisting of one of aluminum and an aluminum alloy and a layer consisting of one of titanium nitride and tungsten.

13. A reflection type liquid crystal display device according to claim 12, wherein the uppermost interlayer insulating film comprises a substantially flat surface directly under the uppermost interconnection layer.

14. A reflection type liquid crystal display device according to claim 11, wherein the uppermost interconnection layer comprises a titanium layer and a titanium nitride layer formed on the titanium layer.

15. A reflection type liquid crystal display device according to claim 14, wherein the uppermost interlayer insulating film comprises a substantially flat surface directly under the uppermost interconnect on layer.

16. A reflection type liquid crystal display device according to claim 15, wherein the titanium nitride layer has a thickness of from 0.07 to 0.15 $\mu$m, the titanium layer has a thickness of from 0.02 to 0.05 $\mu$m, and the total thickness of the titanium nitride layer and the titanium layer is from 0.1 to 0.2 $\mu$m.

17. A reflection type liquid crystal display device according to claim 16, wherein an insulation film is deposited on the uppermost interconnection layer and on the uppermost interlayer insulation film directly under the uppermost interconnection layer, the insulation film is then removed until the insulation film has substantially the same height as the uppermost interconnection layer, such that a chip surface is flat.

18. A reflection type liquid crystal display device according to claim 14, wherein the titanium nitride layer has a thickness of from 0.07 to 0.15 $\mu$m, the titanium layer has a thickness of from 0.02 to 0.05 m, and the total thickness of the titanium nitride layer and the titanium layer is from 0.1 to 0.2 $\mu$m.

19. A reflection type liquid crystal display device according to claim 11, wherein the uppermost interlayer insulating film comprises a substantially flat surface directly under the uppermost interconnection layer.

20. A reflection type liquid crystal display device according to claim 11, wherein an insulation film is deposited on the uppermost interconnection layer and on the uppermost interlayer insulation film directly under the uppermost interconnection layer, the insulation film is then removed until the insulation film has substantially the same height as the uppermost interconnection layer, such that a chip surface is flat.

* * * * *